United States Patent
Tanaka et al.

(10) Patent No.: US 7,795,154 B2
(45) Date of Patent: Sep. 14, 2010

(54) METHOD FOR MANUFACTURING SEMICONDUCTOR DEVICE THAT USES LASER ABLATION, TO SELECTIVELY REMOVE ONE OR MORE MATERIAL LAYERS

(75) Inventors: Koichiro Tanaka, Kanagawa (JP); Shunpei Yamazaki, Tokyo (JP)

(73) Assignee: Semiconductor Energy Laboratory Co., Ltd. (JP)

(\*) Notice: Subject to any disclaimer, the term of this patent is extended or adjusted under 35 U.S.C. 154(b) by 342 days.

(21) Appl. No.: 11/842,403

(22) Filed: Aug. 21, 2007

(65) Prior Publication Data

US 2008/0176383 A1 Jul. 24, 2008

(30) Foreign Application Priority Data

Aug. 25, 2006 (JP) ............... 2006-229744

(51) Int. Cl.
*H01L 21/428* (2006.01)

(52) U.S. Cl. .............. 438/738; 438/759; 438/798; 438/940; 257/E21.475

(58) Field of Classification Search ............ 438/940
See application file for complete search history.

(56) References Cited

U.S. PATENT DOCUMENTS

| | | |
|---|---|---|
| 4,594,471 A | 6/1986 | Yamazaki |
| 4,603,470 A | 8/1986 | Yamazaki |
| 4,725,558 A | 2/1988 | Yamazaki et al. |
| 4,861,964 A | 8/1989 | Sinohara |
| 4,927,493 A | 5/1990 | Yamazaki et al. |
| 4,937,129 A | 6/1990 | Yamazaki |
| 4,954,217 A | 9/1990 | Yamazaki et al. |
| 4,970,368 A | 11/1990 | Yamazaki et al. |
| 4,975,145 A | 12/1990 | Yamazaki et al. |
| 5,089,426 A | 2/1992 | Yamazaki et al. |
| 5,187,601 A | 2/1993 | Yamazaki et al. |

(Continued)

FOREIGN PATENT DOCUMENTS

JP 2000-133636 5/2000

(Continued)

OTHER PUBLICATIONS

Yamazaki, S. et al, "Mask-Less Fabrication of A-Si Solar Cell Using Laser Scribe Process," 17th IEEE Photovoltaic Specialists Conference, May 1-4, 1984, IEEE, 1984, pp. 206-211.

(Continued)

*Primary Examiner*—Stephen W Smoot
(74) *Attorney, Agent, or Firm*—Husch Blackwell Sanders LLP

(57) ABSTRACT

To provide a manufacturing apparatus of a semiconductor device, which does not use a stepper in a manufacturing process in the case where mass production of semiconductor devices is carried out by using a large-sized substrate. A thin film formed over a substrate having an insulating surface is selectively irradiated with a laser beam through light control means, specifically through an electro-optical device to cause ablation; accordingly, the thin film is partially removed, thereby processing the thin film in a remaining region into a desired shape. The electro-optical device functions as a variable mask by inputting an electrical signal based on design CAD data of the semiconductor device.

12 Claims, 3 Drawing Sheets

U.S. PATENT DOCUMENTS

| | | | |
|---|---|---|---|
| 5,585,949 | A | 12/1996 | Yamazaki et al. |
| 5,708,252 | A | 1/1998 | Shinohara et al. |
| 5,866,444 | A | 2/1999 | Yamazaki et al. |
| 6,149,988 | A | 11/2000 | Shinohara et al. |
| 6,261,856 | B1 | 7/2001 | Shinohara et al. |
| 6,445,005 | B1 | 9/2002 | Yamazaki et al. |
| 6,641,933 | B1 | 11/2003 | Yamazaki et al. |
| 6,670,637 | B2 | 12/2003 | Yamazaki et al. |
| 6,894,312 | B2 | 5/2005 | Yamazaki et al. |
| 7,112,115 | B1 | 9/2006 | Yamazaki et al. |
| 7,112,374 | B2 | 9/2006 | Yamazaki et al. |
| 7,176,069 | B2 | 2/2007 | Yamazaki et al. |
| 7,180,197 | B2 | 2/2007 | Nishi et al. |
| 7,199,516 | B2 | 4/2007 | Seo et al. |
| 7,202,155 | B2 | 4/2007 | Fukuchi |
| 7,226,819 | B2 | 6/2007 | Maekawa et al. |
| 2003/0194882 | A1* | 10/2003 | Dubowski et al. ........... 438/795 |
| 2005/0043186 | A1 | 2/2005 | Maekawa et al. |
| 2006/0119743 | A1* | 6/2006 | Lin ........................... 348/754 |
| 2006/0158482 | A1 | 7/2006 | Nakamura et al. |
| 2006/0270175 | A1 | 11/2006 | Aoki et al. |
| 2007/0051952 | A1 | 3/2007 | Yamazaki et al. |

FOREIGN PATENT DOCUMENTS

| | | |
|---|---|---|
| JP | 2002-164591 | 6/2002 |
| JP | 2004-98087 | 4/2004 |

OTHER PUBLICATIONS

Yamazki, S. et al, "Fabrication of the Large-Area Integrated a-Si Solar Cells," The Materials Research Society, Mat. Res. Symp. Proc., vol. 70, Apr. 1986, pp. 487-492.

Yamazaki, S. et al, "Mask-Less Fabrication of A-Si Solar Cell Using Laser Scribe Process," Conference Record of the $17^{th}$ IEEE PVSC (Photovoltaic Specialists Conference), IEEE, 1984, pp. 206-211.

Yamazki, S. et al, "Fabrication of the Large-Area Integrated A-Si Solar Cells," Mat. Res. Soc. Symp. Proc. (Materials Research Society Symposia Proceedings), vol. 70, 1986, pp. 487-492.

* cited by examiner

METHOD FOR MANUFACTURING SEMICONDUCTOR DEVICE THAT USES LASER ABLATION, TO SELECTIVELY REMOVE ONE OR MORE MATERIAL LAYERS

BACKGROUND OF THE INVENTION

1. Field of the Invention

The present invention relates to a manufacturing apparatus of a semiconductor device having a circuit including a thin film transistor (hereinafter called a TFT), and a manufacturing method of the semiconductor device. For example, the present invention relates to an electronic device in which an electro-optical device typified by a liquid crystal display panel or a light-emitting display device having an organic light-emitting element is mounted as parts thereof.

In this specification, the semiconductor device refers to general devices that can function by using semiconductor characteristics, and an electro-optical device, a semiconductor circuit, and an electronic device are all included in the semiconductor device.

2. Description of the Related Art

In recent years, attention has been focused on a technique for forming a thin film transistor (TFT) using a semiconductor thin film (with a thickness of about several nanometers to several hundred nanometers) formed over a substrate having an insulating surface. Thin film transistors are widely applied to electronic devices such as an IC and an electro-optical device. In particular, development is urgently required on thin film transistors as switching elements of image display devices.

In general, a lithography technique is used for processing a thin film formed over a substrate having an insulating surface. In a process using a lithography technique, a thin film is processed through a series of steps such as a resist coating step, a resist exposure step using a photomask, a resist development step, an etching step using a resist pattern, and a resist removal step. Therefore, the process using a lithography technique takes up many steps and time, which causes an increase in production cost. For example, when a TFT or the like using amorphous silicon is manufactured, the process using a lithography technique is performed five times, and five different photomasks are required.

In addition, for a photomask used for a lithography technique, a light transmitting base material having a small linear expansion coefficient and a small change depending on humidity, specifically glass or quartz, is used, and a fine mask pattern is formed of a light shielding material over the light transmitting base material. Although light exposure using this photomask can realize a high-precision resist pattern, there is a problem in that the production cost of the photomask is very expensive. Since the amount of time required for photomask production is long, a photomask has disadvantages in a field in which a product development cycle is desired to be short. In addition, with a conventional photomask, only one kind of pattern can be formed. Further, even when a small part of photomask design is desired to be changed, it is difficult to shorten the amount of time required for photomask production.

In addition, when mass production of semiconductor devices is carried out, a method for reducing the production cost by increasing a substrate area is taken. However, when the size of the photomask is increased, the production cost of the photomask is also increased.

Further, a stepper is a very expensive apparatus. The larger the stepper is, the more expensive it is. In the case of using a large-sized substrate, a complex optical system is necessary, and a footprint occupied by an exposure apparatus is increased.

In a resist coating step and a resist development step, a large amount of waste liquid is generated. It is necessary to provide piping for carrying the large amount of waste liquid generated in this manner, and a tank for storing thereof. In addition, since a resist material is easily deteriorated, it is difficult to perform material quality control for always using a fresh resist material in a process.

In this manner, when mass production of semiconductor devices is carried out, even when a substrate area is increased to reduce production cost, there are problems in that the amount of capital investment increases and the number of steps increases in the case of using a lithography technique in a manufacturing process.

The assignee of this application has described a method for processing a thin film to form an opening, in which a laser beam having a wavelength of less than or equal to 400 nm is used, and a light transmitting conductive film is irradiated with a linear beam, in Reference 1: U.S. Pat. No. 4,861,964, Reference 2: U.S. Pat. No. 5,708,252, and Reference 3: U.S. Pat. No. 6,149,988.

SUMMARY OF THE INVENTION

The present invention provides a manufacturing apparatus of a semiconductor device, which does not use a stepper in a manufacturing process in the case where mass production of semiconductor devices is carried out by using a large-sized substrate. In addition, the present invention provides a manufacturing apparatus of a semiconductor device capable of reducing the number of apparatuses which performs mass production and reducing a footprint. Furthermore, the present invention provides a manufacturing apparatus of a semiconductor device capable of processing a thin film, without using a resist material.

A thin film formed over a substrate having an insulating surface is selectively irradiated with a laser beam through light control means, specifically through an electro-optical device to cause ablation; accordingly, the thin film is partially removed, thereby processing the thin film in a remaining region into a desired shape. The electro-optical device arranged in an optical path between a light source of the laser beam and the substrate having the insulating surface functions as an optical shutter or a light reflector. A manufacturing method disclosed in this specification is a method for manufacturing a semiconductor device, which includes stacking a first material layer and a second material layer sequentially over a substrate; transmitting a laser beam having one of a rectangular shape and a linear shape through an electro-optical device; removing selectively the second material layer or removing selectively the first material layer and the second material layer by selectively scanning one of the first material layer and the second material layer with the laser beam, and by ablating one of the first material layer and the second material layer. Note that, a position through which light is transmitted in the electro-optical device is changed multiple times during scanning of the laser beam. In the case of using three layers, the manufacturing method is a method for manufacturing a semiconductor device, which includes stacking a first material layer, a second material layer, and a third material layer sequentially over a substrate; transmitting a laser beam having one of a rectangular shape and a linear shape through an electro-optical device; removing the second material layer and the third material layer or removing the first material layer, the second material layer, and the third material layer by selectively scanning at least one of the first material layer, the second material layer, and the third material layer with the laser beam and by ablating the second material layer by laser beam irradiation.

A manufacturing apparatus of the present invention includes at least a light source of a laser beam, an optical system for shaping the laser beam into a rectangular beam, an electro-optical device functioning as an optical shutter or a light reflector, means for holding a substrate (e.g., stage), and a control device. In order to obtain a laser beam with an intensity to perform an ablation of a thin film, it is preferable to use a rectangular beam or a linear beam which much easily converges than a plane beam having a large area with which a whole substrate is irradiated collectively. The laser beam with the intensity to perform the ablation of the thin film may have an energy density ranging from 1 $\mu J/cm^2$ to 100 $J/cm^2$. Note that, when the longitudinal length of a rectangular beam or a linear beam is equal to or more than one side of the substrate, a scanning path along which treatment is performed on the entire substrate can be simplified, which is preferable. However, in the case of performing processing of a thin film with high fineness in consideration of the amount of aberration of the optical system, the longitudinal length of the rectangular beam is preferably short, and the shape of the laser beam is preferably square when the intensity to perform the ablation of the thin film can be ensured.

As a laser beam, a laser emitted from one or a plurality of the following can be used: a gas laser such as an Ar laser, a Kr laser or an excimer laser; a laser of which the medium is single crystalline YAG; $YVO_4$, forsterite ($Mg_2SiO_4$), $YAlO_3$, $GdVO_4$, or polycrystalline (ceramic) YAG, $Y_2O_3$, $YVO_4$, $YAlO_3$, $GdVO_4$, each added with one or more of Nd, Yb, Cr, Ti, Ho, Er, Tm and Ta as a dopant; a glass laser; a ruby laser; an alexandrite laser; a Ti:sapphire laser; a copper vapor laser; or a gold vapor laser. In particular, by using a laser beam emitted from a pulsed laser oscillated at a pulse width of 1 femtosecond to 10 picoseconds, a high intensity laser beam can be obtained; a nonlinear optical effect (multiphoton absorption) can be generated; and a light transmitting material layer can also be ablated. In the case of using the laser beam emitted from the pulsed laser oscillated at a pulse width of 1 femtosecond to 10 picoseconds, an ablation can be generated sufficiently even when energy density is 1 $\mu J/cm^2$ to 1 $mJ/cm^2$. In addition, in the case of using a solid state laser a laser medium of which is solid, the solid state laser has an advantage in that a maintenance-free condition can be kept for a long time and an advantage in that an output is relatively stable.

In addition, the control device includes a memory portion (RAM, ROM, or the like) which stores design data of a semiconductor device, or a microprocessor including a CPU or the like, and the control device controls a position of the laser beam on a thin film surface which is irradiated with the laser beam through an electro-optical device by inputting an electrical signal based on design CAD data of the semiconductor device to the electro-optical device. For example, when a stage to which a substrate to be processed is fixed is moved, emission timing of the light source of the laser beam, the electrical signal to be inputted to the electro-optical device, and movement speed of the stage are synchronized.

Further, the electro-optical device functions as a variable mask by inputting the electrical signal based on the design CAD data of the semiconductor device. By changing an electrical signal inputted to the electro-optical device to serve as an optical shutter, the processing pattern of the thin film can be changed. As such electro-optical device, an element which can regulate an area where light is selectively transmitted, for example, an element having a liquid crystal material or an element having an electrochromic material; or an element which can selectively regulate the light reflection, for example, a digital micromirror device (also referred to as a DMD) are given. The DMD is a kind of a spatial light modulator, and is a device in which a plurality of small size mirrors, called micromirrors, which rotates around a fixed axis due to electrostatic field operation or the like, is arranged on a semiconductor substrate made of Si or the like, in matrix. The DMD can modulate a laser beam spatially.

In addition, as another electro-optical device, a PLZT element which is an optical element that modulates transmitted light by an electro-optic effect can be used. Note that the PLZT element is oxide ceramics containing lead, lantern, zircon, and titanium, and is a device called PLZT which is an acronym made from the initial letters of each element symbol. Although the PLZT element transmits light since it is transparent ceramic, a light deflection direction can be changed when a voltage is applied, and a light control device is formed in combination with a polarizer. The electro-optical device is formed in such a way that the PLZT elements are arranged in matrix and an electrode and a switching element are provided so that a voltage can be applied to each of the PLZT elements, and an area through which the laser beam is transmitted is controlled by the electro-optic effect. The PLZT element can modulate a laser beam spatially.

In the electro-optical device, a region through which a beam can be transmitted is the same size as or smaller than the substrate to be processed. In the electro-optical device, when the region through which the beam can be transmitted is the same size as the substrate to be processed, the laser beam is scanned while the substrate to be processed and the electro-optical device are aligned with each other and each position of the substrate to be processed and the electro-optical device is fixed. Note that, in this case, in a single processing of the thin film, the electrical signal is inputted to the electro-optical device for one time.

In order to miniaturize a manufacturing apparatus, the electro-optical device may be a slim rectangular shape so that at least a rectangular beam can be transmitted through or reflect off. For example, in the case of using a slim DMD, since the number of micromirrors which control an angle of reflection can be small, a modulation rate can be faster. In a single processing of the thin film, the number of changes of an electrical signal to be inputted to the DMD is multiple times, and a position at which light is reflected by the digital micromirror device is changed multiple times during scanning of the laser beam. In addition, in the case of using a slim liquid crystal optical shutter, the number of scan lines or signal lines is decreased and the driving speed can be faster; therefore, a similar effect can be obtained. Further, when the electro-optical device is a slim rectangular shape, in the single processing of the thin film, the number of changes of the electrical signal to be inputted to the electro-optical device is multiple times, and a position through which light is transmitted in the electro-optical device is changed multiple times during scanning of the laser beam. The electrical signal to be inputted to the electro-optical device is sequentially changed to be synchronized with scanning of the rectangular beam, and thus, the processing of the thin film is continuously performed. For example, a scanning method of the rectangular beam is that a laser light source is fixed, an optical system for shaping a laser beam transmitted therethrough or reflected thereby into a rectangular beam in the electro-optical device is fixed as well, and a substrate stage is moved in a direction perpendicular to the longitudinal direction of the irradiation region.

Instead of a stage holding a substrate, a substrate may be moved by a method in which the substrate is floated by spraying gas thereon. As the size of a large-sized substrate, the size of 590 mm×670 mm, the size of 600 mm×720 mm, and the size of 650 mm×830 mm are used in a production line, and it is supposed that the size of 680 mm×880 mm, the size of 730 mm×920 mm, or the size which is equal to or larger than these can be used. In the case of using a glass substrate one side of which is more than 1 m, it is preferable to move the substrate by a transportation method by which deflection by its own weight of the substrate can be reduced, for example, by a method in which the substrate is floated by spraying gas thereon. The method in which the substrate is floated by spraying gas thereon can perform cooling of the substrate with sprayed gas and reduce damage to the substrate due to excessive heat.

In addition, a plurality of electro-optical devices is arranged in an optical path between the light source of the laser beam and the substrate having the insulating surface, and a more minute processing may be performed.

In the case of processing a large-sized substrate, a plurality of the above-described electro-optical devices and a plurality of the above-described laser light sources may be used for one substrate to shorten processing time. For example, in the case of using the two electro-optical devices and the two laser light sources, one pair is in charge of one half of the substrate and performs processing of a thin film, and the other pair is in charge of the other half of the substrate and performs processing of the thin film; thus, processing of the thin film on the entire surface of the substrate may be terminated finally. Note that since the control device can have common data designed with a CAD device, one control device can be used for a plurality of laser light sources. In particular, a structure in which a plurality of laser light sources is used is effective in the case where a thin film corresponding to a large portion of the entire area of the substrate is removed by a laser beam ablation.

In addition, it is preferable to provide position alignment means which is electrically connected to the control device. The alignment of an irradiation position can be performed with high accuracy by providing an image sensor such as a CCD camera and performing laser irradiation based on data obtained from the image sensor. Further, a position marker can be formed in such a way that a desired position of this manufacturing apparatus is irradiated with the laser beam.

In the case where dust is generated by a laser ablation, it is preferable to provide blow means which prevents dust from being adhered to a surface of a substrate to be processed or vacuum means of dust, in the manufacturing apparatus. While performing a laser ablation, by blowing or vacuuming dust at the same time, dust can be prevented from being adhered to the surface of the substrate to be processed. In addition, while performing the laser ablation, by blowing or vacuuming dust at the same time, cooling of the substrate can be performed and damage to the substrate due to excessive heat can be reduced.

One structure of the present invention disclosed in this specification is a manufacturing apparatus including a light source unit for emitting a laser beam; an optical system for shaping the laser beam into one of a rectangular shape and a linear shape; light control means for selectively shielding and controlling the laser beam having one of the rectangular shape and the linear shape; and scanning means for scanning a surface of an irradiated body with a laser beam transmitted through the light control means, in which the laser beam transmitted through the light control means removes an irradiated region of the irradiated body. Note that this structure achieves at least one of the above-described objects.

In the above structure, as the light control means, an electro-optical device which switches between a light shielding portion of the light control means and a light transmitting portion of the light control means with an inputted electrical signal, so-called optical shutter, can be used. However, it is not necessary to completely shield a laser beam with the light shielding portion of the light control means, and it is necessary that light intensity be reduced to such an extent that an ablation of a region to be irradiated is not generated even when a surface to be irradiated is irradiated with a laser beam transmitted through the light shielding portion of the light control means. As a typical optical shutter, a liquid crystal element is given. In addition, in order to transmit the laser beam, it is preferable to use a liquid crystal element which can withstand the passage of the laser beam.

In addition, in the above structure, as the light control means, an electro-optical device which switches between a deflection portion of the light control means and a light transmitting portion of the light control means with an inputted electrical signal can be used. As this electro-optical device, for example, PLZT elements arranged in matrix are given. Since the PLZT element is oxide ceramics, the PLZT element is an element which has high heat resistance and can withstand the passage of the laser beam; therefore, the PLZT element can be said as light control means suitable for the present invention.

In addition, another structure of the present invention is a manufacturing apparatus including a light source unit for emitting a laser beam; an optical system for shaping the laser beam into one of a rectangular shape and a linear shape; light control means for selectively reflecting and controlling the laser beam having one of the rectangular shape and the linear shape; and scanning means for scanning a surface of an irradiated body with a laser beam reflected by the light control means, in which the laser beam reflected by the light control means removes an irradiated region of the irradiated body. Note that this structure achieves at least one of the above-described objects.

In the above structure, as the light control means, an element which switches a reflection direction of the light control means with an inputted electrical signal, so-called DMD, can be used. In addition, in order to reflect a laser beam, it is preferable to use a micromirror which can withstand irradiation of the laser beam.

In addition, in each of the above structures, a control device for controlling the light source unit and the light control means may be provided as well. Each of the light source unit and the light control means can be synchronized with each other by using the control device for controlling the light source unit and the light control means, and the fear that the laser beam emitted from the light source unit damages the light control means can be prevented.

In addition, in each of the above structures, a control device for controlling the light source unit, the light control means, and the scanning means may be provided as well. Each of the light source unit, the light control means, and the scanning means can be synchronized with each other by using the control device for controlling the light source unit, the light control means, and the scanning means. By efficiently performing scanning with a laser beam using the control device for controlling the light source unit, the light control means, and the scanning means, an ablation in a desired region can be performed.

In addition, in each of the above structures, when a longitudinal direction of the laser beam having one of the rectangular shape and the linear shape is perpendicular to a scanning direction with the scanning means, a band-shaped irradiation region can be provided, and the laser beam can scan the whole surface to be irradiated collectively or separately.

In addition, the irradiated body has a feature in which the irradiated body is a stack in which a first material layer and a second material layer are sequentially stacked over a substrate; and the second material layer is removed or the first material layer and the second material layer are removed by ablating one of the first material layer and the second material layer by laser beam irradiation. Alternatively, the irradiated body is a stack in which a first material layer, a second material layer, and a third material layer are sequentially stacked over a substrate; and the second material layer and the third material layer are removed or the first material layer, the second material layer, and the third material layer are removed by ablating the second material layer by laser beam irradiation. In the case where an irradiated body has three material layers, a method for manufacturing a semiconductor device is used, which includes stacking a first material layer, a second material layer, and a third material layer sequentially over a substrate; transmitting a laser beam having one of a rectangular shape and a linear shape through an electro-optical device; removing the second material layer and the third material layer or removing the first material layer, the second material layer, and the third material layer by selectively scanning at least one of the first material layer, the second material layer, and the third material layer with the laser beam and by ablating the second material layer by laser beam irradiation.

Note that the substrate is a light transmitting substrate, for example, a glass substrate or a quartz substrate. In particular, a large-sized substrate, specifically, a substrate one side of which is more than 1 m is useful for mass production.

A phenomenon in which an irradiated region of the irradiated body by laser beam irradiation is removed is referred to as an ablation, and a process to perform that action is referred to as an ablation process.

Note that in this specification, an ablation includes both sublimation in which an irradiation region and a material layer at the periphery thereof are each changed from a solid state to a gas state by laser beam irradiation, and evaporation in which the material layer is changed from a solid state to a gas state through a liquid state. Whether an ablation is performed through sublimation or evaporation which is determined depending on a material of the material layer which is irradiated with the laser beam.

According to the present invention, the time to manufacture a photomask can be saved, and it is possible to process a thin film without a resist material.

In addition, since the light control means can be controlled by using data designed with a CAD device, desired thin film processing can be performed with high precision and at low cost.

DETAILED DESCRIPTION OF THE INVENTION

Embodiment Mode 1

Hereinafter, embodiment modes of the present invention will be described.

Figure 1:
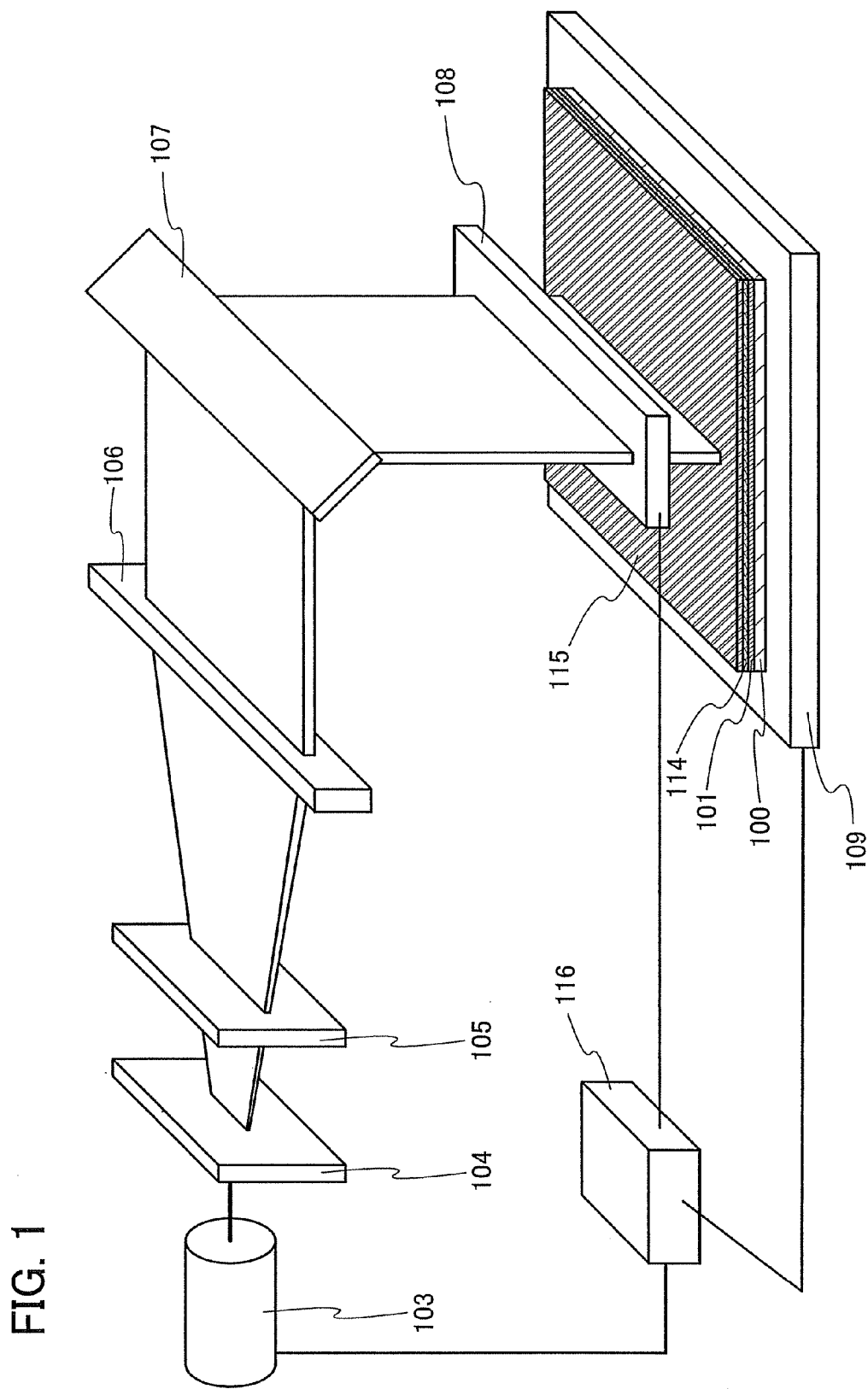
FIG. 1 is a perspective diagram showing an example of a manufacturing apparatus of the present invention.

FIG. 1 is a perspective diagram showing an example of a manufacturing apparatus of the present invention. A laser beam to be emitted is outputted from a laser oscillation device 103 (a YAG laser device, an excimer laser device, or the like); the laser beam is transmitted through a first optical system 104 for changing a beam shape into a rectangular shape, a second optical system 105 for shaping, and a third optical system 106 for obtaining collimated beam; and an optical path is inverted into a direction perpendicular to a substrate 100 by using a reflecting mirror 107. Then, the laser beam is transmitted through an electro-optical device 108 that regulates an area and a position which selectively transmit light, and a surface to be irradiated is irradiated with the laser beam.

The electro-optical device 108 regulates an area and a position which transmit the laser beam by using a control device 116 such as a computer. By changing an electrical signal to be inputted to the electro-optical device 108, the area and the position which transmit the laser beam are changed, and a region to be ablated is controlled. However, as the electro-optical device 108, a device which can withstand the laser beam even when the laser beam is transmitted through the device is used.

In FIG. 1, in order to downsize the manufacturing apparatus, the electro-optical device 108 has a rectangular shape approximately the same as the laser beam and is smaller than the substrate 100. However, the present invention is not limited in particular, and the electro-optical device 108 may have the same size as the substrate 100.

The shape of a laser spot on an irradiated surface is preferably a rectangular shape or a linear shape, specifically a rectangular shape a short side of which may be 1 mm to 5 mm and a long side of which may be 10 mm to 50 mm. In the case of using an excimer laser with a pulse width of several tens of nanoseconds, an appropriate range of the excimer laser may lie within the range of the energy density of 1 $J/cm^2$ to 10 $J/cm^2$. In addition, in the case of using a continuous wave laser, an energy density of 100 $J/cm^2$ at about 1 ms can be obtained; therefore, it is necessary to set a condition as appropriate. If small aberration is desired, a laser spot may be a square of 5 mm×5 mm to 50 mm×50 mm. Furthermore, in the case of using a large-sized substrate, a long side of a laser spot is preferably in the range from 20 cm to 100 cm in order to shorten processing time. In addition, a plurality of laser oscillation devices and a plurality of optical systems which are shown in FIG. 1 may be provided and a large-sized substrate may be processed in a short time. Specifically, two electro-optical devices are provided above a substrate stage, and areas in one substrate may be separately processed by laser beam irradiation from a laser oscillation device corresponding to each electro-optical device.

Note that FIG. 1 is an example, and the positional relationship of each optical system and the electro-optical device which are arranged in the optical path of the laser beam is not limited in particular. For example, when the laser oscillation device 103 is provided above the substrate 100 and is arranged so that the laser beam emitted from the laser oscillation device 103 is perpendicular to a substrate surface, a reflecting mirror is not necessarily used. In addition, as each optical system, a collective lens, a beam expander, a homogenizer, a polarizer, a slit, or the like may be used; or these may be combined with each other.

By two-dimensionally scanning the irradiation region of the laser beam on a surface to be irradiated as appropriate, irradiation is performed on a large area of a substrate. In order to perform scanning, the irradiation region of the laser beam and the substrate are relatively moved. Here, scanning is performed with moving means (not shown) for moving a substrate stage 109 which holds the substrate in X and Y directions.

It is preferable that the control device 116 be interlocked so as to control the moving means for moving the substrate stage 109 in the X and Y directions. In addition, it is preferable that the control device 116 be interlocked so as to control the laser oscillation device 103. Furthermore, it is preferable that the control device 116 be interlocked with a position alignment mechanism for recognizing a position marker.

The irradiated body which is irradiated with the laser beam is a stack in which a first material layer 101, a second material layer 114, and a third material layer 115 are sequentially stacked over the substrate 100. By ablating the second material layer 114 by laser beam irradiation, the second material layer 114 and the third material layer 115 are removed, or the first material layer 101, the second material layer 114, and the third material layer 115 are removed. Note that the second material layer 114 is formed of a material in which an ablation is generated more easily than the first material layer 101 and the third material layer 115, for example, a material which has a low boiling point or a low sublimation point, or a material which easily generates gas.

In addition, heat-resistant metal is preferably used for the first material layer 101; for example, tungsten, tantalum, or the like is used. Further, chromium (boiling point of 2672° C.), aluminum (boiling point of 2467° C.), or the like which is a material having a relatively low boiling point or a relatively low sublimation point is used for the second material layer. Furthermore, an inorganic insulating film, for example, a silicon oxide film, a silicon oxynitride film, or the like is used for the third material layer.

In the case where the substrate 100 is less subject to damage of the laser beam, or in the case where an energy density of the laser beam can be made small, the irradiated body is not limited to three layers, and the irradiated body may have two layers as well.

Figure 2A:
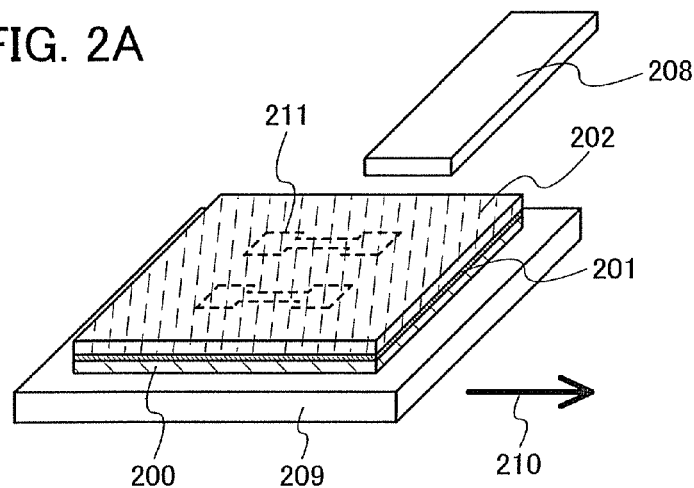
FIGS. 2A to 2C are schematic diagrams showing a process by using a manufacturing apparatus of the present invention.
Figure 2B:
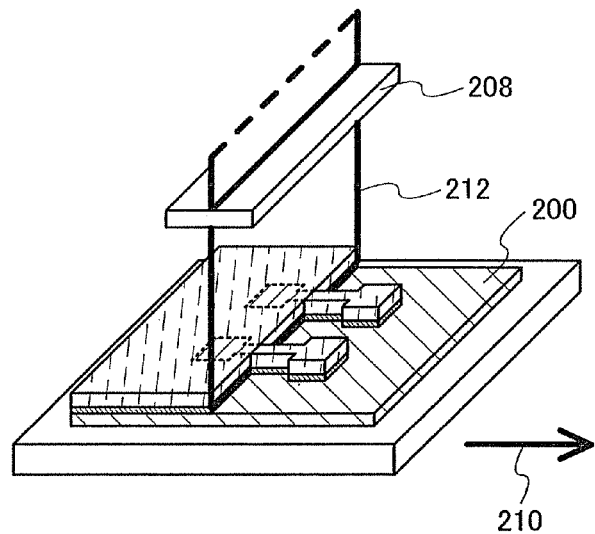
Figure 2C:
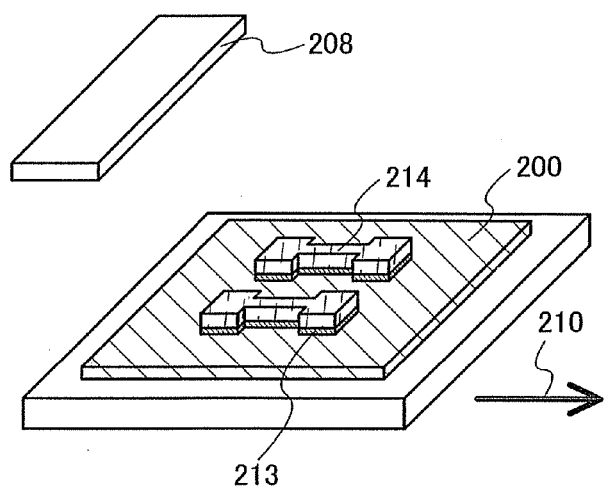

Here, FIGS. 2A, 2B and 2C show states before and after laser ablation process in the case where the irradiated body has two layers.

FIG. 2A is a perspective diagram showing a state before a laser ablation process.

An electro-optical device 208 is provided above a substrate stage 209, and a substrate 200 is provided over the substrate stage 209. Note that the electro-optical device 208 of FIG. 2A corresponds to the electro-optical device 108 of FIG. 1, and an optical system and a laser oscillation device are not illustrated in FIG. 2A for simplification.

A first material layer 201 formed of an amorphous silicon film containing hydrogen and a second material layer 202 formed of a silicon oxynitride film are consecutively stacked over the substrate 200 by a PCVD method.

First, after the position alignment of the substrate and the laser beam is performed, the substrate 200 provided with the stack is moved in a scanning direction 210 shown by an arrow in FIG. 2A. Note that a region 211 shown by a dotted line in FIG. 2A shows a pattern position of the stack which is desired to be left after laser ablation, and data thereof is stored in a control device connected to the electro-optical device.

Next, a laser beam 212 is scanned, and a laser ablation process is selectively performed with the electro-optical device 208. FIG. 2B is a perspective diagram showing a state during the laser ablation process. Here, an example is shown, in which a linear-shaped laser beam is used for collectively processing the substrate and a long side of the laser beam is approximately equal to the size of one side of the substrate. When the amorphous silicon film containing hydrogen is irradiated with the laser beam, an ablation is easily generated by degasification, and the second material layer 202 thereover is removed together with the amorphous silicon film. The laser beam 212 transmitted through a transmission portion of the electro-optical device 208 removes the stack, and a region shielded from light by a light shielding portion of the electro-optical device 208 is left to form a stack pattern. Note that the light shielding portion of the electro-optical device 208 is not required to completely block light, and the light shielding portion of the electro-optical device 208 may weaken at least the intensity of the laser beam so that an irradiated region is prevented from being ablated. Here, the laser beam 212 is scanned, while an electrical signal to be inputted to the electro-optical device 208 with the control device is changed based on design data, and the light shielding portion of the electro-optical device 208 and the transmission portion thereof are changed.

Next, termination of the laser ablation process is determined with the position alignment mechanism which recognizes an end surface of the substrate or the position marker, so that emission of the laser beam of the laser oscillation device is stopped, or laser irradiation on the substrate is terminated with a shutter FIG. 2C is a perspective diagram showing this stage.

As shown in FIG. 2C, an island-shaped first material layer 213 and an island-shaped second material layer 214 can be formed over the substrate 200 by just performing the laser ablation process. The island-shaped first material layer 213 is an amorphous silicon film containing hydrogen, and an amorphous silicon TFT in which the island-shaped first material layer 213 serves as an active layer can be formed. In addition, in order to reduce the size of the island-shaped first material layer 213, the island-shaped second material layer 214 may be used as a mask, and wet etching may be performed.

Note that FIG. 2C shows the example showing two patterns for making the diagram easy to understand; however, in the case where semiconductor devices are actually mass-produced, innumerable patterns are formed over one substrate.

In addition, when a chromium film is used for the first material layer 201 and a silicon oxynitride film is used for the second material layer 202, a stack having a desired shape can be left by similarly performing a laser ablation process. This process is referred to as a LAPP (Laser Ablation Patterning Process). A chromium film formed in this way can be used as a wiring.

In this manner, by using the manufacturing apparatus shown in FIG. 1, patterning of a semiconductor layer or patterning of a wiring can be performed without using a photomask. Therefore, a part or all of a manufacturing process of a semiconductor device can be performed without using a photomask.

A main surface of the substrate is not limited to being provided in a direction parallel to a horizontal plane, and the main surface of the substrate may be provided obliquely or perpendicularly with respect to the horizontal plane. A laser beam can be scanned while a main surface of a large-sized substrate remains oblique by setting design of an optical system or a substrate transport system, as appropriate. When the main surface of the substrate is oblique or perpendicular with respect to the horizontal plane, the footprint of a manufacturing apparatus can be reduced further. In addition, when a device capable of film formation in a state that the main surface of the substrate is obliquely or perpendicularly with respect to the horizontal plane, for example, a sputtering apparatus or the like is connected to the manufacturing apparatus of the present invention, substrate transport can be smoothly performed and a film formation process (a sputtering process) and a film processing process (an ablation process) can be consecutively performed.

Embodiment Mode 2

In this embodiment mode, an example will be described, in which a plurality of electro-optical devices is provided in an optical path of a laser beam from a laser oscillation device in FIG. 3.

A laser beam to be emitted is outputted from a laser oscillation device 303 (a YAG laser device, an excimer laser device, or the like); the laser beam is transmitted through a first optical system 304 for changing a beam shape into a rectangular shape, a second optical system 305 for shaping, and a third optical system 306 for obtaining collimated beam; and after the laser beam transmitted through a first electro-optical device 308a, an optical path is inverted into a direction perpendicular to a substrate 300 by using a reflecting mirror 307. Then, the laser beam is transmitted through a second electro-optical device 308b and a third electro-optical device 308c, and a surface to be irradiated is irradiated with the laser beam. The first electro-optical device 308a, the second electro-optical device 308b, and the third electro-optical device 308c can separately regulate an area and a position which selectively transmit light.

By using a plurality of electro-optical devices, an area and a position which transmit the laser beam can be controlled with high precision. For example, a transmission type liquid crystal element in which liquid crystal shutters are arranged in matrix of 120×30 is used as the second electro-optical device 308b, and a transmission type liquid crystal element in which liquid crystal shutters are arranged in a matrix of 1024× 768 is used as the third electro-optical device 308c, so that an area to be shielded from light can be shared. Specifically, the second electro-optical device 308b and the third electro-optical device 308c can be combined with each other in such a way that shielding is performed in a large area, which is desired to be shielded from light, of design patterns by using the second electro-optical device 308b, and that shielding is performed in a small area and a position, which are desired to be shielded from light precisely, of design patterns by using the third electro-optical device 308c.

Since distance is close to the laser oscillation device and laser beam intensity is higher than that of the other electro-optical devices, a PLZT element is preferably used for the first electro-optical device 308a. The PLZT element can control a shutter at higher speed than the liquid crystal element. In this way, different kinds of electro-optical devices can be combined.

The three electro-optical devices regulate an area and a position which transmit the laser beam by using a control device 316 such as a computer. By changing each electrical signal to be inputted to the three electro-optical devices, the area and the position which transmit the laser beam are changed, and a region to be ablated is controlled.

Similarly to the manufacturing apparatus described in Embodiment Mode 1, by two-dimensionally scanning the irradiation region of the laser beam on a surface to be irradiated as appropriate, irradiation is performed on a large area of a substrate. In order to perform scanning, the irradiation region of the laser beam and the substrate are relatively moved. Here, scanning is performed with moving means (not shown) for moving a substrate stage 309 which holds the substrate in the X and Y directions. It is preferable that the control device 316 be interlocked so as to control the moving means for moving the substrate stage 309 in the X and Y directions. In addition, it is preferable that the control device 316 be interlocked so as to control the laser oscillation device 303. Furthermore, it is preferable that the control device 316 be interlocked so as to control the reflecting mirror 307.

The irradiated body which is irradiated with the laser beam is a stack in which a first material layer 301, a second material layer 314, and a third material layer 315 are sequentially stacked over the substrate 300. By ablating the second material layer 314 by laser beam irradiation, the second material layer 314 and the third material layer 315 are removed, or the first material layer 301, the second material layer 314, and the third material layer 315 are removed. Note that the second material layer 314 is formed of a material in which an ablation is generated more easily than the first material layer 301 and the third material layer 315, for example, a material which has a low boiling point or a low sublimation point, or a material which easily generates gas.

In the case where the substrate 300 is less subject to damage of the laser beam, or in the case where an energy density of the laser beam can be made small, the irradiated body is not limited to three layers, and the irradiated body may have two layers as well.

Figure 3:
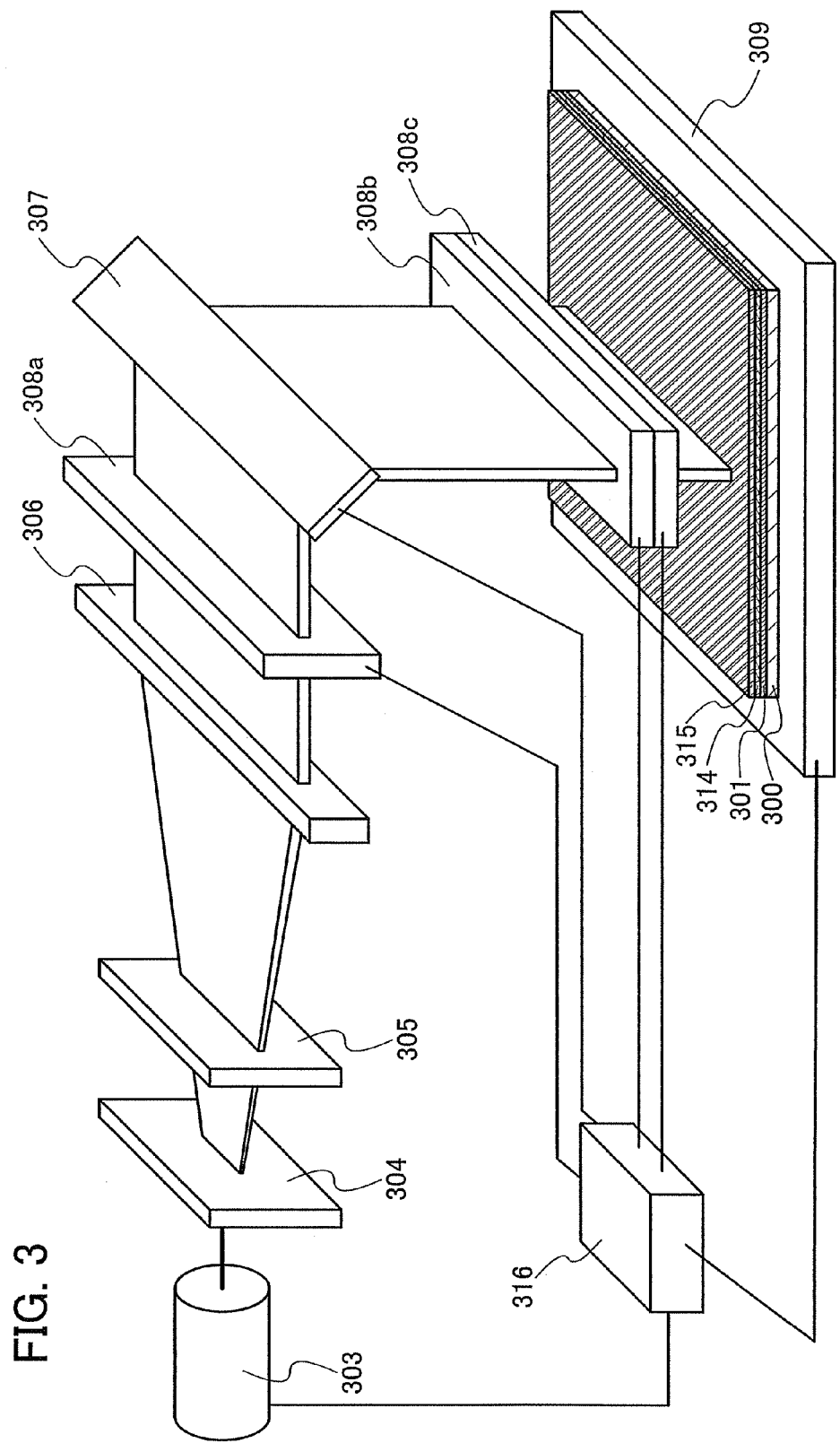
FIG. 3 is a perspective diagram showing another example of a manufacturing apparatus of the present invention.

FIG. 3 shows the example in which the three electro-optical devices are used. However, the number of electro-optical devices is not limited in particular as long as a laser ablation process is possible, and two electro-optical devices may be used or four or more electro-optical devices may be used as well. In addition, each size of the three electro-optical devices can be varied; in that case, a magnifying lens, a projection lens, a reducing glass, or the like may be arranged in an optical path of the laser beam, as appropriate.

In addition, this embodiment mode can be freely combined with Embodiment Mode 1.

Embodiment Mode 3

In this embodiment mode, an example will be described, in which a DMD is arranged in an optical path of a laser beam.

Light from a laser oscillation device is shaped into a rectangular laser beam by an optical system, and delivered to the DMD. In the DMD, the light is reflected only by a micromirror at a predetermined position, out of micromirrors arranged in matrix, and led to a surface to be processed. The position of each micromirror in this DMD is controlled by a control device such as a computer. A pattern of an irradiation region over the surface to be processed is controlled based on design data inputted to the control device, and a laser ablation process is performed with respect to the irradiation region.

In order to perform the above-described laser ablation process, by using a collective lens, a beam expander, a homogenizer, a slit, a polarizer, or the like as appropriate, an optical system may be designed and the DMD may be arranged.

Since the DMD does not transmit a laser beam but reflects it, the DMD is useful because damage caused by the laser beam is small and loss of energy is small, compared with the transmission type liquid crystal element. However, it is preferable to design an optical system so as not to ablate a reflective material of the micromirror by laser beam irradiation, or it is preferable to use a reflective material which is difficult to be ablated for the micromirror.

In addition, this embodiment mode can be freely combined with Embodiment Mode 1 and Embodiment Mode 2.

For example, when this embodiment mode is combined with Embodiment Mode 2, reflection is selectively performed by using the DMD instead of the reflecting mirror 307, and a laser ablation can be performed with the laser beam transmitted through the electro-optical device 308a. In this case, it is preferable that the DMD be controlled by the control device 316 as well as the electro-optical device.

Since space for a resist coater, a waste disposal apparatus of a resist material, and a stepper is not required, a footprint can be reduced, and a small manufacturing apparatus can be realized.

The manufacturing apparatus of the present invention can be used as a manufacturing apparatus of a display device such as a liquid crystal display, a plasma display, or an EL display; or as a manufacturing apparatus of a semiconductor integrated circuit. That is, the manufacturing apparatus of the present invention can be used instead of a conventional photolithography process which has been widely used as a fine processing technique of a semiconductor device and a display device.

This application is based on Japanese Patent Application serial No. 2006-229744 filed in Japan Patent Office on Aug. 25, 2006, the entire contents of which are hereby incorporated by reference.

What is claimed is:

1. A method for manufacturing a semiconductor device, comprising:
    stacking a first material layer and a second material layer sequentially over a substrate;
    transmitting a laser beam having at least one of a rectangular shape and a linear shape through an electro-optical device; and
    selectively removing at least the second material layer by selectively scanning at least one of the first material layer and the second material layer with the laser beam, and by ablating at least one of the first material layer and the second material layer,
    wherein the first material layer serves as an active layer of a thin film transistor.

2. The method for manufacturing the semiconductor device according to claim 1, further comprising a step of selectively removing the first material layer by selectively scanning at least one of the first material layer and the second material layer with the laser beam, and by ablating at least one of the first material layer and the second material layer.

3. The method for manufacturing the semiconductor device according to claim 1, wherein a position through which light is transmitted in the electro-optical device is changed multiple times during scanning of the laser beam.

4. A method for manufacturing a semiconductor device, comprising:
    stacking a first material layer, a second material layer, and a third material layer sequentially over a substrate;
    transmitting a laser beam having at least one of a rectangular shape and a linear shape through an electro-optical device; and
    selectively removing at least the second material layer and the third material layer by selectively scanning at least one of the first material layer, the second material layer, and the third material layer with the laser beam and by ablating the second material layer by laser beam irradiation,
    wherein the first material layer serves as an active layer of a thin film transistor.

5. The method for manufacturing the semiconductor device according to claim 4, further comprising a step of selectively removing the first material layer by selectively scanning at least one of the first material layer and the second material layer with the laser beam, and by ablating at least one of the first material layer and the second material layer.

6. The method for manufacturing the semiconductor device according to claim 4, wherein a position through which light is transmitted in the electro-optical device is changed multiple times during scanning of the laser beam.

7. A method for manufacturing a semiconductor device, comprising:
    stacking a first material layer and a second material layer sequentially over a substrate;
    irradiating a laser beam which is modulated by a digital micromirror device and having at least one of a rectangular shape and a linear shape; and
    selectively removing at least the second material layer by selectively scanning at least one of the first material layer and the second material layer with the laser beam, and by ablating at least one of the first material layer and the second material layer,
    wherein the first material layer serves as an active layer of a thin film transistor.

8. The method for manufacturing the semiconductor device according to claim 7, further comprising a step of selectively removing the first material layer by selectively scanning at least one of the first material layer and the second material layer with the laser beam, and by ablating at least one of the first material layer and the second material layer.

9. The method for manufacturing the semiconductor device according to claim 7, wherein a position at which light is reflected by the digital micromirror device is changed multiple times during scanning of the laser beam.

10. A method for manufacturing a semiconductor device, comprising:
    stacking a first material layer, a second material layer, and a third material layer sequentially over a substrate;
    irradiating a laser beam which is modulated by a digital micromirror device and having at least one of a rectangular shape and a linear shape; and
    selectively removing at least the second material layer and the third material layer by selectively scanning at least one of the first material layer, the second material layer, and the third material layer with the laser beam and by ablating the second material layer by laser beam irradiation,
    wherein the first material layer serves as an active layer of a thin film transistor.

11. The method for manufacturing the semiconductor device according to claim 10, further comprising a step of selectively removing the first material layer by selectively scanning at least one of the first material layer and the second material layer with the laser beam, and by ablating at least one of the first material layer and the second material layer.

12. The method for manufacturing the semiconductor device according to claim 10, wherein a position at which light is reflected by the digital micromirror device is changed multiple times during scanning of the laser beam.

* * * * *